United States Patent
Hung et al.

(10) Patent No.: US 6,868,009 B1
(45) Date of Patent: Mar. 15, 2005

(54) FLASH MEMORY DEVICE WITH BYTE ERASE

(75) Inventors: Chun-Hsiung Hung, Hsinchu (TW); Chin-Hung Chang, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 10/726,124

(22) Filed: Dec. 2, 2003

Related U.S. Application Data

(60) Provisional application No. 60/512,821, filed on Oct. 20, 2003.

(51) Int. Cl.[7] ............................................... G11C 16/04
(52) U.S. Cl. .............................. 365/185.12; 365/185.11; 365/185.29
(58) Field of Search ........................ 365/185.12, 185.11, 365/185.29, 185.22

(56) References Cited

U.S. PATENT DOCUMENTS

| | | | |
|---|---|---|---|
| 5,646,890 A | 7/1997 | Lee et al. | |
| 6,222,775 B1 | 4/2001 | Cappelletti | |
| 6,510,081 B2 | 1/2003 | Blyth et al. | |
| 6,717,846 B1 * | 4/2004 | Lee et al. | 365/185.12 |
| 2004/0027856 A1 * | 2/2004 | Lee et al. | 365/185.11 |

* cited by examiner

*Primary Examiner*—Huan Hoang
(74) *Attorney, Agent, or Firm*—Hoynes Roffel & Wolfeld LLP

(57) ABSTRACT

A process and a memory architecture is based on "vertical" pages, and support byte by byte erasure. A byte within a "vertical" page is erased, and then other bytes within the "vertical" page sharing bit lines with the erased byte, are subjected to a program verify operation after exposure to the stress caused by the erase process. The other bytes in the page are re-programmed to recover the data if they fail verify. Therefore, byte erase is executed without the erase/re-program cycling, and only memory cells within the same vertical page as the erased byte, which suffer stress from the erase potentials on the shared bit lines sufficient to shift their thresholds out of range, are re-programmed.

33 Claims, 4 Drawing Sheets

FLASH MEMORY DEVICE WITH BYTE ERASE

REFERENCE TO RELATED APPLICATION

The present application claims the benefit of Provisional U.S. Patent Application No. 60/512,821, entitled FLASH MEMORY WITH BYTE ERASE, invented by Hung et al., filed on 20 Oct. 2003.

BACKGROUND OF THE INVENTION

1. Field of the Invention

The present invention relates to electrically programmable and erasable non-volatile memory and integrated circuits including such memory, and more particularly to architectures for such devices supporting byte erase.

2. Description of Related Art

Electrically programmable and erasable non-volatile memory technologies, including flash memory, are being adapted to many applications. Technologies based upon floating gates like standard EEPROM, or charge trapping layers like oxide-nitride-oxide memory cells NROM, are typically programmable and erasable many times. In typical flash memory technologies, the erase processes are executed over an entire array, or large sections of memory cells in an array, in parallel. Thus, in order to erase one target byte, the erase process is executed that erases the array or section, and the portions of the section other than the target byte must be re-programmed, in procedures referred to as erase/re-program cycling. Erase/re-program cycling is relatively time-consuming, particularly when the size of the section being erased is large.

Also, flash memory technologies have limited lifetimes, expressed as a number of times that the memory cell can be erased or programmed before failure. Because erase/re-program cycling requires re-programming of the erased sections even when the data in a majority of the erased memory cells is not being changed, it significantly limits the lifetime of the memory array.

Accordingly, it is desirable to provide systems and methods for erasing flash memory arrays byte by byte.

SUMMARY OF THE INVENTION

The present invention provides a process and a memory architecture based on "vertical" pages, which support byte by byte erasure. According to embodiments of the present invention, a byte within a "vertical" page is erased, and then other bytes within the "vertical" page sharing bit lines with the erased byte, are subjected to a program verify operation after exposure to the stress caused by the erase process. The other bytes in the page are re-programmed to recover the data if they fail verify. Therefore, byte erase is executed without the erase/re-program cycling, and only memory cells within the same vertical page as the erased byte, which suffer stress from the erase potentials on the shared bit lines sufficient to shift their thresholds out of range, are re-programmed.

The present invention is embodied by integrated circuit devices. The integrated circuit devices comprise a memory array supporting vertical pages. In some embodiments the memory array is physically or logically configured so that it includes a plurality of sectors. The respective sectors include a plurality of blocks. The respective blocks include a plurality of programmable and erasable memory cells arranged in rows and columns. A plurality of word lines is coupled to memory cells along respective rows within a particular sector. A plurality of bit lines is coupled to memory cells along respective columns within a block in the particular sector. The integrated circuit device includes decoder circuitry coupled to the plurality of word lines and to the plurality of bit lines. The decoder circuitry addresses one byte at a time by selecting one word line within the particular sector, and one bit line within each block in a set of blocks of the particular sector for erase processes. Thus, one memory cell in each block coupled to the selected word line contributes one bit to the selected byte. A controller is coupled to the decoder circuitry, and includes resources for erasing one byte at a time within a selected "vertical" page.

The "vertical" page consists of one byte in each row of memory cells within the particular sector. The bytes in the "vertical" page are coupled to different word lines but share the same bit lines as other bytes in the "vertical" page. In contrast, a "horizontal" page typical of prior part memory architectures consists of a plurality of bytes sharing the same word line.

The controller comprises a state machine in some embodiments of the present invention, or other logic structures, such as a general-purpose processor executing software instructions. The controller includes circuitry to map data stored in memory cells in the selected "vertical" page. Also, the controller includes circuitry to apply erase potentials to the word line and the bit lines coupled to the memory cells storing the selected byte. After applying the erase potentials, the controller exercises logic to verify that the memory cells the selected "vertical" page other than the selected erased byte have maintained thresholds indicated by the mapping, after being stressed by the erase potentials. For memory cells that fail the verify process, program potentials are applied to re-program them.

In embodiments of the invention, the circuitry to map the memory cells coupled to word lines in the selected "vertical" page other than that word line coupled to the erased byte, includes logic to read data in the selected page and to store addresses of memory cells having a programmed threshold level in temporary storage. The verify procedure accesses only those memory cells identified in the map stored temporary storage. In other embodiments, the circuitry to map the memory cells includes logic to read the data in the selected page, and to store the data itself as a map in temporary storage. In yet other embodiments, the circuitry to map the memory cells includes logic to read the data in the selected page, and to set word line flags corresponding with word lines coupled to memory cells having a programmed threshold level.

The circuitry to map the memory cells coupled to word lines in the selected page is executed either before or after the application of the erased potentials to the selected byte.

The erase potentials according to some embodiments of the invention comprise a negative voltage on a word line coupled to memory cells storing the selected byte, and a positive voltage on the bit lines coupled to the memory cells in the set of blocks.

The controller in some embodiments includes circuitry to apply erase potentials on the word line coupled to the memory cells storing the selected byte, and on the bit lines coupled to the memory cells in the plurality of blocks storing the selected byte, and to apply erase inhibit potentials to other word lines in the plurality of word lines in the particular sector. Also, in some embodiments, bit lines other than those coupled to the memory cells storing the selected byte are disconnected or allowed to float during the application of the erase potentials.

The present invention is also embodied by a method for byte by byte erasure in a flash memory device, which is logically or physically configured to support "vertical" pages. Methods according to the present invention comprise:

addressing one byte at a time in a selected page by selecting one word line and a set of bit lines for erase processes;

mapping data in memory cells coupled to word lines in the selected page other than the selected one word line;

applying erase potentials to memory cells storing the addressed byte; and after applying erase potentials to memory cells storing the addressed byte, verifying that memory cells coupled to word lines in the selected page other than the selected one word line have maintained thresholds indicated by the mapping, and applying program potentials to memory cells in the selected page that do not pass verify.

The flash memory array according to the present invention is implemented using nonvolatile charge programmable memory cells in some embodiments. In some embodiments, the memory cells consist of NROM devices. In other embodiments, the memory cells consist of floating gate devices typically used in EEPROMs.

Thus, the present invention adopts a vertical page array organization, and a byte by byte erase algorithm with vertical page reprogramming. Device endurance is significantly improved by avoiding the erase/re-program cycling of prior art flash memories. Also, flexibility in the erase process is improved.

Other aspects and advantages of the present invention can be seen on review of the drawings, the detailed description and the claims, which follow.

DETAILED DESCRIPTION

A detailed description of embodiments of the present invention is provided with reference to FIGS. 1–6.

Figure 1:
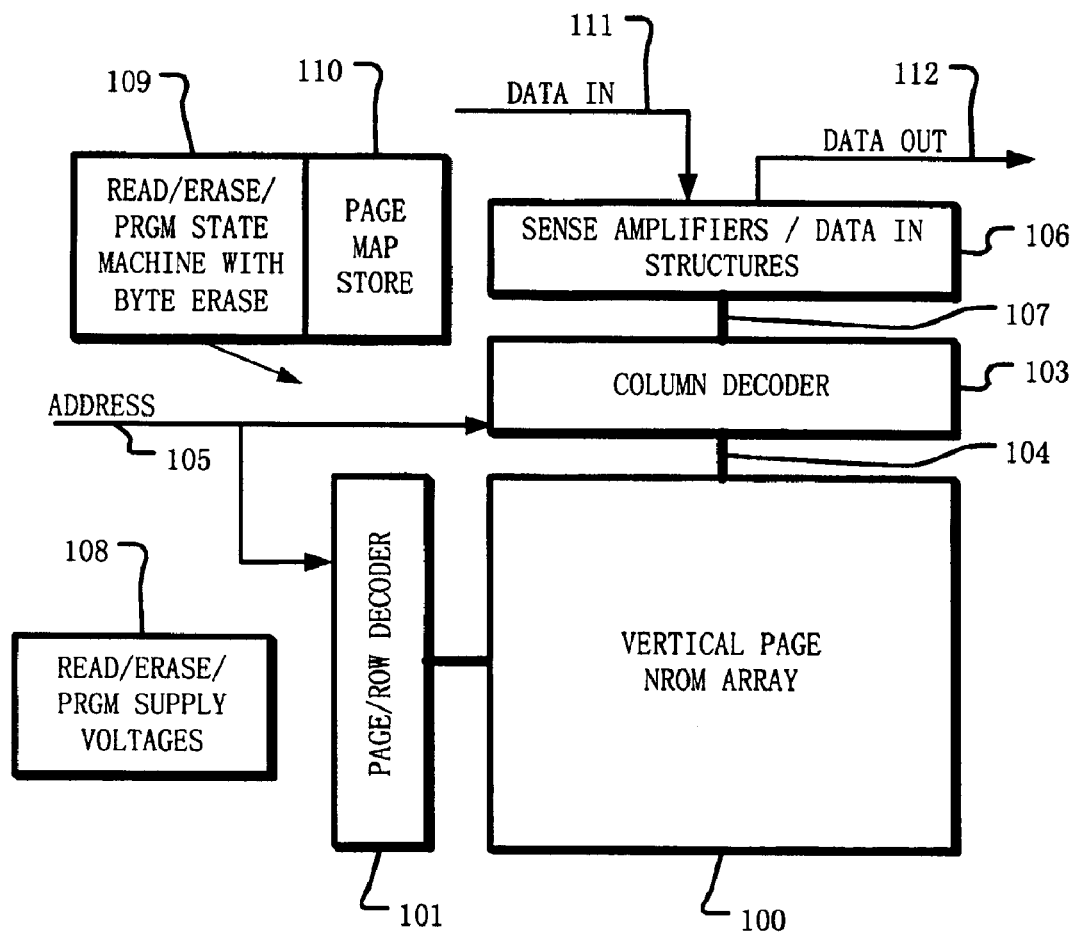
FIG. 1 is a simplified block diagram of an integrated circuit according to the present invention.

FIG. 1 is a simplified block diagram of an integrated circuit supporting byte erase and vertical pages according to the present invention. The integrated circuit includes a memory array 100 implemented using NROM memory cells and supporting vertical pages. The memory array 100 is configured logically or physically as described below with reference to FIGS. 2 and 3 in some embodiments. A page/row decoder 101 is coupled to a plurality of word lines 102 arranged along rows in the memory array 100. A column decoder 103 is coupled to a plurality of bit lines 104 arranged along columns in the memory array 100. Addresses are supplied on bus 105 to column decoder 103 and page/row decoder 101. Sense amplifiers and data-in structures in block 106 are coupled to the column decoder 103 via data bus 107. Data is supplied via the data-in line 111 from input/output ports on the integrated circuit to the data-in structures in block 106. Data is supplied via the data out line 112 from the sense amplifiers in block 106 to input/output ports on the integrated circuit.

Resources for controlling the reading, programming and erasing of memory cells in the array 100 are included on the chip. These resources include read/erase/program supply voltage sources represented by block 108, and the state machine 109, which are coupled to the array 100, the decoders 101, 103 and other circuitry on the integrated circuit, which participates in operation of the device.

The supply voltage sources 108 are implemented in various embodiments using charge pumps, voltage regulators, voltage dividers and the like as known in the art, for supplying various voltage levels, including negative voltages, used in the read, erase and program operations.

The state machine 109 supports read, erase and program operations, including byte erase according to the present invention. The state machine 111 can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the state machine.

In the embodiment shown in FIG. 1, a page map store 110 is coupled with the state machine 109. The page map store 110 in this embodiment may comprise SRAM type memory for temporary storage of page map data as discussed below. In yet other embodiments, the page map store 110 may be implemented by a plurality of latches or registers associated with word lines in the plurality of word lines 102, for storing word line flags as discussed below.

The integrated circuit shown in FIG. 1 may include other components not shown in figure. For example, the components shown in FIG. 1 may be part of a system on a chip SOC integrated circuit, having a general-purpose processor, SDRAM memory, communication circuitry, and the like formed on the same chip.

Figure 2:
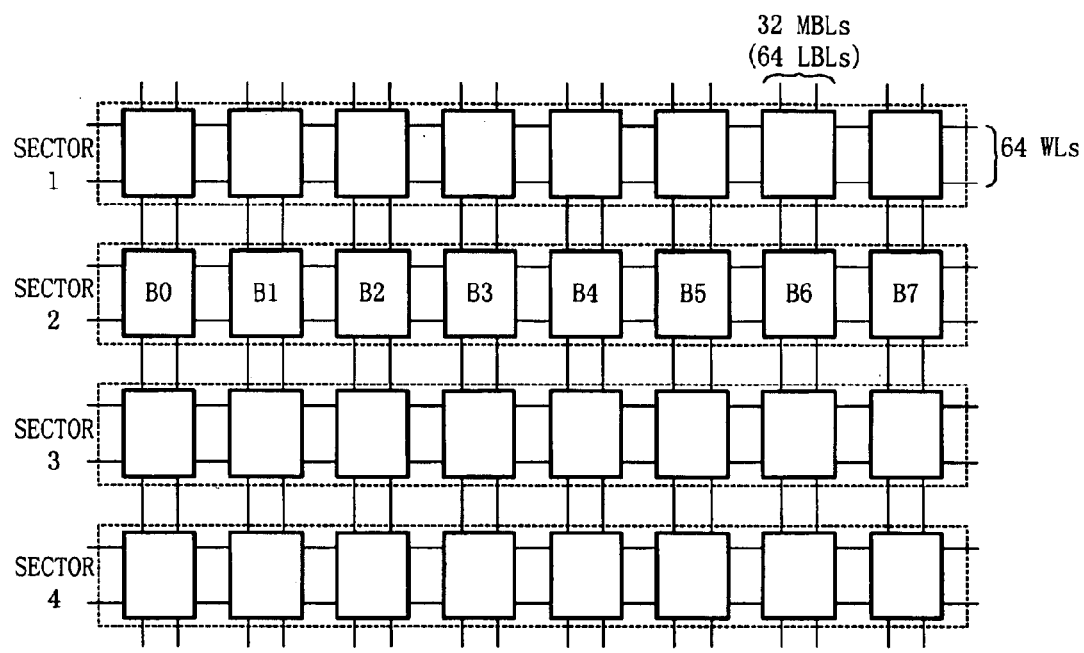
FIG. 2 illustrates a configuration of a memory array including vertical pages, blocks and sectors used in some embodiments of the present invention.

FIG. 2 shows configuration of a memory array supporting vertical pages according to an embodiment of the present invention. The array in the illustrated embodiment includes four sectors, labeled sector 1, sector 2, sector 3, and sector 4. Each sector includes eight blocks, labeled B0–B7 in sector 2, so that there are four rows and eight columns of blocks in the array. There are 64 word lines extending along the rows through all eight blocks in each sector. There are 64 local bit lines LBLs, coupled to 32 global metal bit lines MBLs extending along the columns in each block in each sector. The bit lines extend along the columns through corresponding blocks in the four sectors. Eight input/output IO structures, not shown, each IO structure including a sense amplifier and a data-in circuit, are coupled to corresponding sets of 32 global bit lines serving respective ones of the eight columns of blocks.

Figure 3:
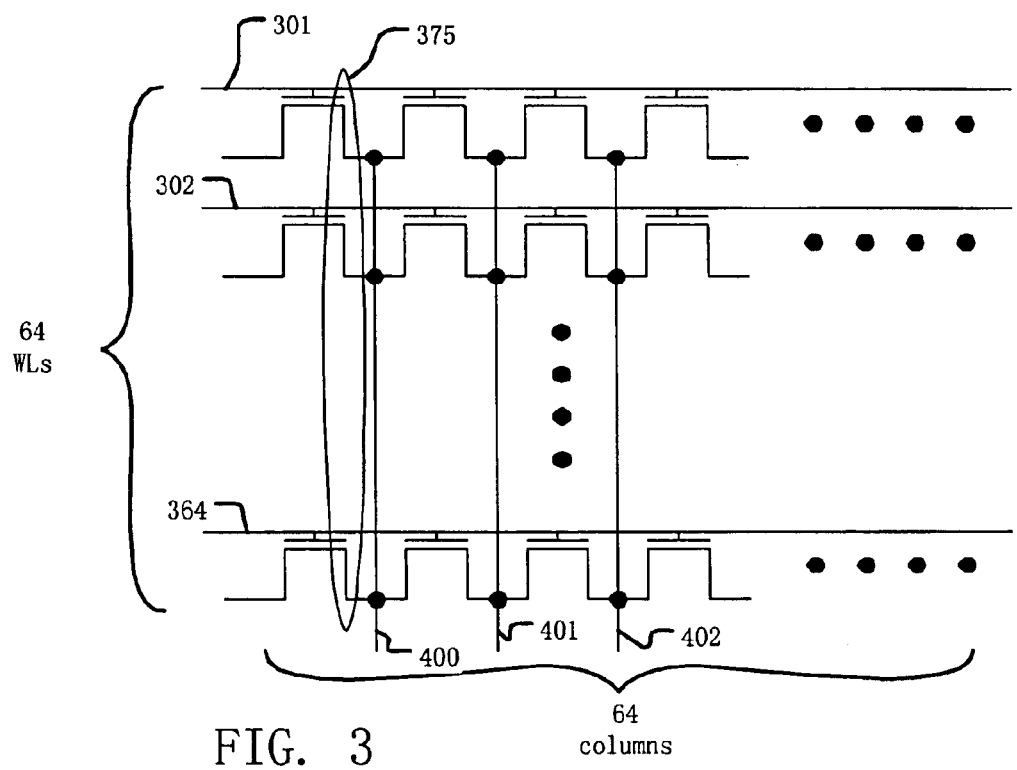
FIG. 3 illustrates a block of memory cells in a memory array supporting vertical pages configured as shown in FIG. 2.

FIG. 3 illustrates the configuration of one block, such as block B2, in the array of FIG. 2. The block includes 64 rows of memory cells coupled to 64 word lines 301, 302, . . . 364. Likewise, the block includes 64 columns of memory cells coupled to 64 local bit lines 400, 401, 402, . . . . In preferred embodiments, the local bit lines 400, 410, 402, . . . are coupled by switch transistors for each block to a set of global metal bit lines (not shown) so that two columns of memory cells share one global metal bit line. Thus, the configuration shown in FIGS. 2 and 3 can be characterized as follows:

Page size: 64WL*1BL*8IO=512 bits=64 bytes

Sector size: 64WL*64LBL*8IO=32K bits=4K bytes

Array size: 4 Sectors*4K Bytes=16 K bytes

The memory cells in the block are implemented using NROM technology in one preferred embodiment. NROM technology is also known as semiconductor-oxide-nitride-oxide-semiconductor SONOS technology. See U.S. Pat. No. 6,011,725 for a description of such NROM technology. In other embodiments, more typical EEPROM memory cells based on floating gate charge storage structures can be utilized. For example, the PACAND style floating gate memory cell used in devices available from Macronix International Co. Ltd, Hsinchu, Taiwan, can be utilized.

In the NROM embodiment, data may be stored on two sides of the memory cells in some embodiments. In other embodiments, the data is stored on one side. Where the data is stored on one side, each block contributes one column of bits, such as column 375, to each column of bytes in a vertical page. Thus, the column of bytes in a vertical page in sector 2 includes one column of bits from each of the eight blocks B0–B7. Where the data is stored on both sides of the NROM cell, the vertical page for erase purposes is two bytes wide, because the erase potentials applied to the word line and the shared local bit line will erase one side of each memory cell coupled to the shared local bit line.

For an array using NROM cells, the program, erase and re-program potentials are illustrated in the following table.

|  | Selected WL | Selected BL | Unselected WL | Unselected BL |
|---|---|---|---|---|
| PROGRAM | 11.5V | 5–8V | 0V | 0V |
| ERASE | −3V | 8V | 1V(0V) | Float |
| RE-PROGRAM | 11.5V | 5V | 0V | 0V |

As shown in the table, for the program process, a selected word line is set at about 11.5 volts. A selected bit line is set at five (5) volts for a first program pulse, and for subsequent pulses increased to a final level of about eight (8) volts. Unselected word lines and unselected bit lines are set at ground potential. [What is the source potential? It appears that a greater potential is set across a selected word line and an unselected bit line than across a selected word line and a selected bit line]. In a re-program operation, a single pulse with a five volt bit line potential is applied without a following program verify step, in some embodiments. In alternative embodiments, a program sequence including a program pulse, program verify and retry for failed bits is executed.

In an erase process, the selected word line receives a potential of about negative three (−3) volts, the selected bit line receives a potential of about eight (8) volts, the unselected word line receives a potential of about one (1) volt or ground (0), and the unselected bit line is allowed to float. The erase condition is illustrated schematically in FIG. 4.

Figure 4:
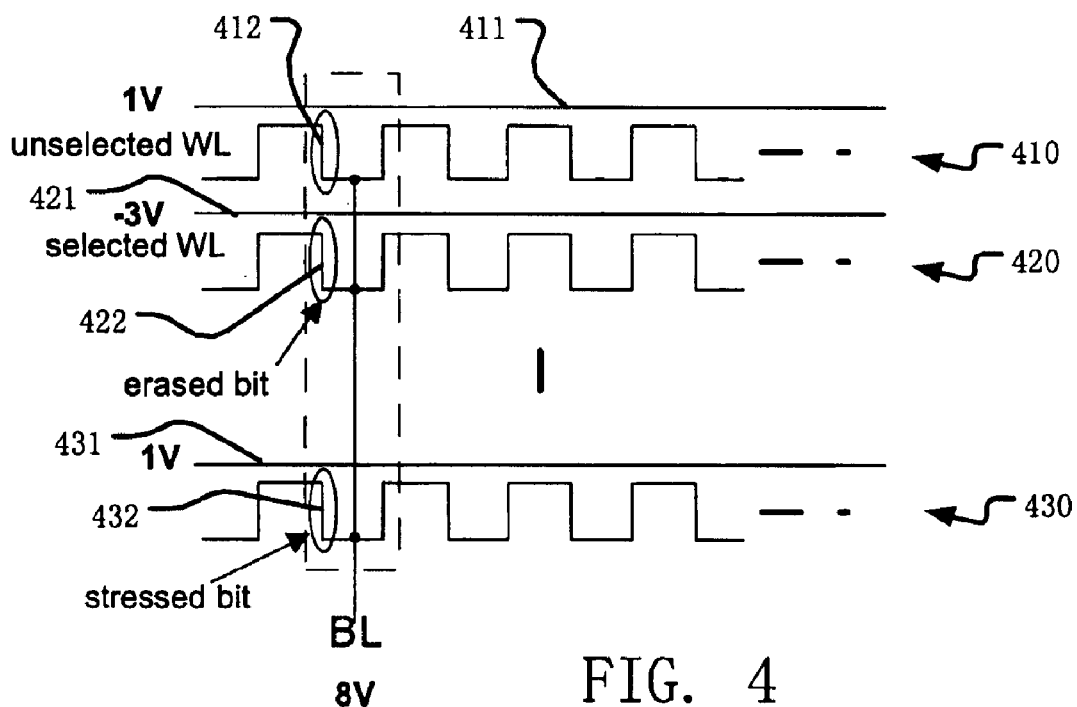
FIG. 4 is a diagram illustrating potentials applied in a byte erase process for a vertical page according to embodiments of the present invention.

FIG. 4 shows a block of memory cells including a first row 410, a second row 420, and a last row 430. The second row 420 includes memory cells storing data of a selected byte, and the word line 421 for the selected row receives a potential of about negative three volts. The word line 411 for the first row 410 and the word line 431 for the last row 430 receive an erase inhibit voltage of about one volt. The bit line 430 for the column of cells in the selected page receives an erase potential of about eight volts.

The memory cell 422 on the second row will be erased with the erase potentials applied as shown in FIG. 4. The memory cells in cells in the same column, including the memory cell 412 on the first row, and the memory cell 432 on the last row, will suffer columns stress because of the high potential applied to the bit line, which they share with the erased cell. Thus it can be seen that "stress" occurs tending to cause a shift in the threshold voltage VT of the memory cell in rows coupled to unselected word lines that use a bit line in common with the erased memory cell.

The byte erase algorithm according to the present invention follows the application of the erase potential with a program verify operation to test the stressed memory cells. If the stressed memory cells suffer a shift in threshold voltage $V_T$ sufficient to move the threshold out of an acceptable range for the data programmed in the memory cell, then the cells receive a re-program pulse to recover the data.

Figure 5:
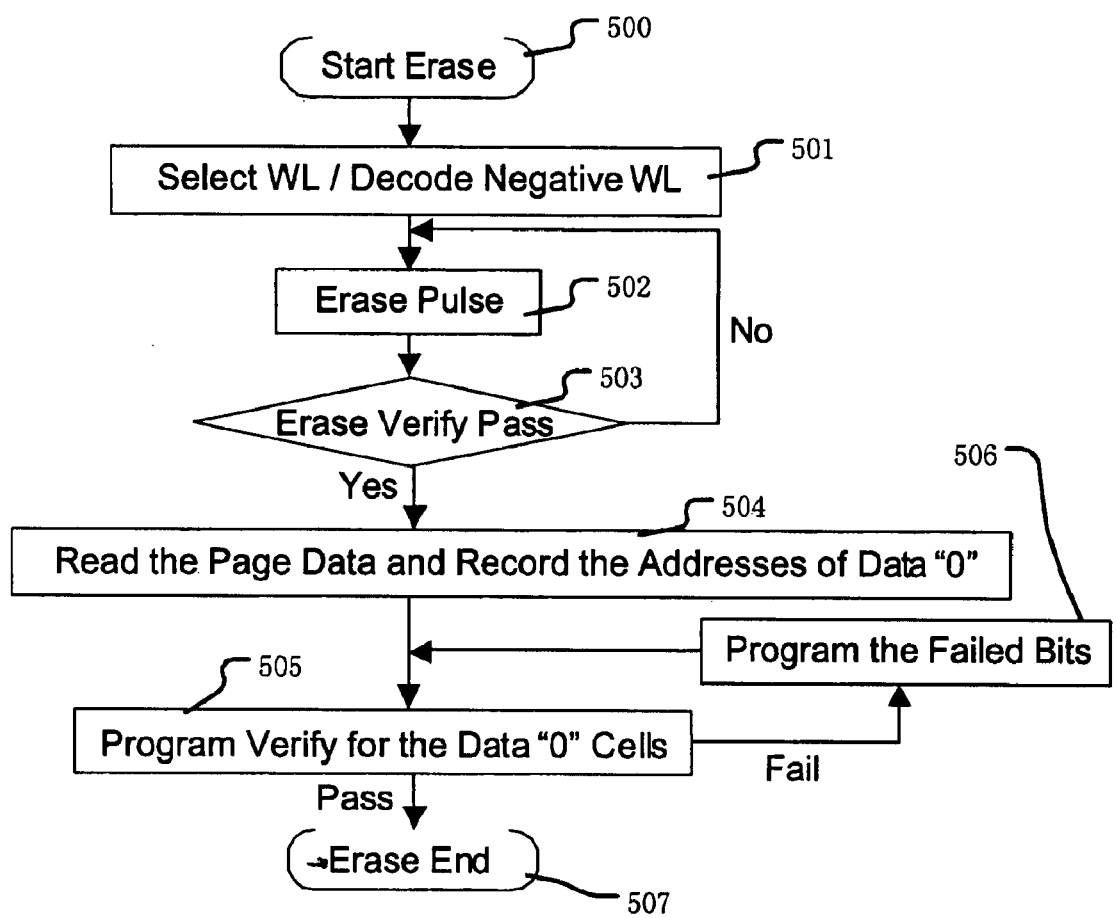
FIG. 5 is a flow chart illustrating a byte erase process according to an embodiment of the present invention.

One algorithm according to the present invention for controlling the byte erase process on vertical pages according to the present invention is shown in FIG. 5. In the procedure of FIG. 5, the process begins in response to an erase command (step 500). In the first step, one word line is selected and negative voltage decoding is applied for provision of a negative voltage on the selected word line and erase inhibit voltages on the other word lines in the sector (Step 501). Next, an erase pulse is applied to the bit lines coupled to the memory cells storing the selected byte (step 502). After applying the erase pulse, and erase verify operation is executed by which data in the erased cell is read to ensure successful erasure, indicated by a threshold voltage VT below a specified level, such as below about 0.5 volts for example (step 503). If the selected byte does not pass erase verify, then the process loops to step 502 to repeat the erase pulse until successful erase occurs, or a maximum number of retries is executed. If the selected byte passes the erase verify operation at step 503, then the data in the page is read and mapped in a temporary storage, such as by recording the addresses of memory cells having a programmed threshold voltage $V_T$ (step 504). For example, in a one bit per cell memory cell, a programmed threshold voltage $V_T$ is a high voltage level, such as greater than three volts, to indicate a data value of "0".

For a one bit per cell memory cell, only the addresses are needed in the map. Addresses can be stored by storing offset addresses in temporary storage on-chip, or by setting word line flags in a logical structure having one flag corresponding to each word line in the sector. Likewise, the map may constitute the actual data stored in the page which can be used during a verify operation by simply reading and comparing. If more than one bit per cell is stored as indicated by multiple programmed threshold voltages $V_T$'S, then both the address and the program data values need to be stored in the map.

After creating the map, a program verify operation is executed for the memory cells having a programmed (high) threshold voltage $V_T$, such as those memory cells storing data "0" (step 505). If any memory cells fail the program verify operation, then a re-program pulse is applied to the failed memory cells (step 506). The verify operation is repeated until all the memory cells in the map pass, or a maximum number of retries is executed, at which time the erase process is ended (step 507).

During program verify, a higher WL voltage than is used in the read operation is applied to reserve a high threshold voltage $V_T$ margin.

Figure 6:
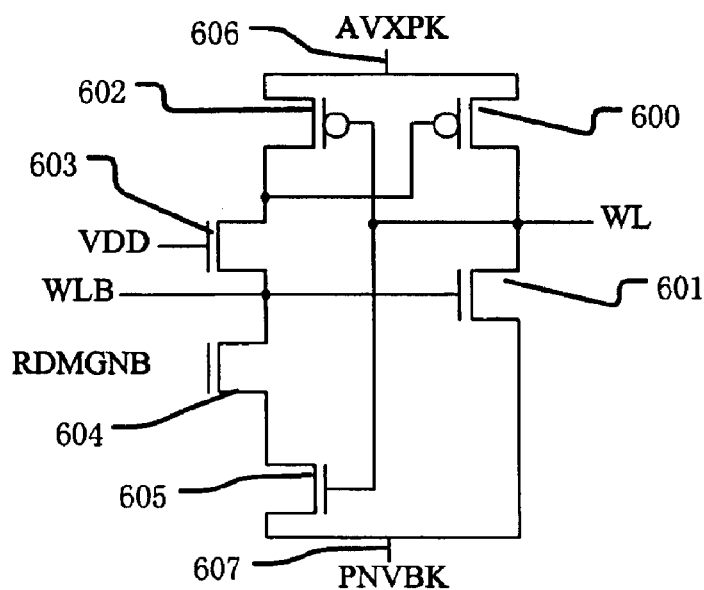
FIG. 6 is a circuit diagram for a word line driver supporting the erase potentials described with reference to FIG. 4.

Embodiments of the page/row decoder of the present invention in the just described NROM embodiment must be capable of applying a negative voltage to a selected word line, while applying ground or slightly positive voltage to unselected word lines in the sector. One embodiment of a word line driver supporting this capability is shown in FIG. 6. The driver in FIG. 6 includes an output stage including p-channel transistor 600 in series with n-channel transistor 601 between a supply node AVXPK on the source of p-channel transistor 600 and a supply node PNVBK on the source of n-channel transistor 601. The word line WL being driven by the driver is coupled to the node between the drains of the p-channel transistor 600 and the n-channel transistor 601. An input stage includes p-channel transistor 602 in series with n-channel transistors 603, 604 and 605. The gates of the p-channel transistor 602 and the n-channel transistor 605 are coupled to the output node on the word line WL in a latch arrangement. N-channel transistor 603 has its gate coupled to a reference voltage, such as VDD, and acts in a cascode function. N-channel transistor 604 has its gate coupled to reference potential RDMGNB, which is at a lower level than the reference voltage on the gate of transistor 603. The input WLB to the driver, supplied from address decoding logic, is applied at the node between the source of transistor 603 and the drain of transistor 604. Likewise, the input WLB is coupled to the gate of the n-channel transistor 601 in the output stage. The node between the drains of n-channel transistor 603 and p-channel transistor 602 is coupled to the gate of p-channel transistor 600 in the output stage. The voltages on terminals of the driver of FIG. 6 during operation are shown in the following table.

|  | Selected WL | Unselected WL |
|---|---|---|
| AVXPK | 0V | 0V |
| PNVBK | −3V | −3V |
| WLB | VDD | −3V |

The present invention provides a byte-wise erase-ability in flash memory based on NROM technology, having an endurance almost as good as floating gate based EEPROM. Also, improvements in performance are achieved for other memory cell technologies as well.

While the present invention is disclosed by reference to the preferred embodiments and examples detailed above, it is to be understood that these examples are intended in an illustration rather than in a limiting sense. It is contemplated that modification and combinations will readily occur to those skilled in the art, which modification and combinations will be within the spirit of the invention and the scope of the following claims.

What is claimed is:

1. An integrated circuit device, comprising:
a memory array including a plurality of word lines and a plurality of bit lines, and configured to support vertical pages, vertical pages including a plurality of byte wide sets of memory cells, the byte wide sets of memory cells being coupled to respective word lines in the plurality of word lines, and coupled to bit lines in the plurality of bit lines in common with the other byte wide sets of memory cells of the vertical page;

decoder circuitry coupled to the memory array, the decoder circuitry addressing one byte at a time by selecting one word line in the plurality of word lines, and the bit lines in common with the other byte wide sets of memory cells of the vertical page for erase processes; and a controller coupled to the decoder circuitry to control erasing of at least one selected byte within a selected page stored in memory cells coupled to a selected one word line, the controller including circuitry to map data stored in memory cells coupled to word lines in the selected page other than the selected one word line, to apply erase potentials to memory cells storing the at least one selected byte, and after applying erase potentials to memory cells storing the at least one selected byte, to verify that the memory cells in the selected page other than the memory cells coupled to the selected one word line have maintained thresholds indicated by the mapping, and to apply program potentials to memory cells in the selected page that do not pass verify.

2. The integrated circuit device of claim 1, wherein the memory array includes
a plurality of sectors, the respective sectors including a plurality of blocks, the respective blocks including a plurality of programmable and erasable memory cells arranged in rows along the plurality of word lines, and in columns along the plurality of bit lines;
wherein the byte wide set of memory cells includes one memory cell from each block in the plurality of blocks, and wherein the bit lines in common with the other byte wide sets of memory cells of the vertical page include one selected bit line within each block in the set of blocks of a particular sector.

3. The integrated circuit device of claim 1, wherein said byte wide set of memory cells includes eight memory cells.

4. The integrated circuit device of claim 1, including temporary storage, and wherein the circuitry to map the memory cells coupled to word lines in the selected page other than the selected one word line includes logic to read data in the selected page, and to store addresses of memory cells having a programmed threshold level in the temporary storage.

5. The integrated circuit device of claim 1, including temporary storage comprising a plurality of word line flags, and the circuitry to map memory cells coupled to word lines in the selected page other than the selected one word line includes logic to read data in the selected page, and to set flags in the plurality of word line flags for word lines coupled to memory cells having a programmed threshold level in temporary storage.

6. The integrated circuit device of claim 1, including temporary storage, and wherein the circuitry to map memory cells coupled to word lines in the selected page other than the selected one word line includes logic to read data in the selected page, and to store read data in the temporary storage.

7. The integrated circuit device of claim 1, wherein the circuitry to map memory cells coupled to word lines in the selected page other than the selected one word line, executes after the circuitry applies erase potentials to the selected byte.

8. The integrated circuit device of claim 1, wherein the circuitry to map memory cells coupled to word lines in the selected page other than the selected one word line, executes before the circuitry applies erase potentials to the selected byte.

9. The integrated circuit device of claim 1, wherein said at least one selected byte consists of one byte.

10. The integrated circuit device of claim 1, wherein two columns of memory cells are coupled to each of said bit lines in the plurality of bit lines, and memory cells in the two columns coupled to a particular bit line on a particular word line are erased by the erase potentials applied to the particular word line and the particular bit line, and wherein said at least one selected byte consists of two bytes and the vertical page is two bytes wide.

11. The integrated circuit device of claim 1, wherein said memory cells comprise charge programmable memory cells.

12. The integrated circuit device of claim 1, wherein said memory cells comprise NROM memory cells.

13. The integrated circuit device of claim 1, wherein said memory cells comprise floating gate memory cells.

14. The integrated circuit device of claim 1, wherein said controller comprises a state machine, and voltage supply circuits.

15. The integrated circuit device of claim 1, wherein said erase potentials comprise a negative voltage on a word line coupled to memory cells storing the selected byte and a positive voltage on the bit lines coupled to the memory cells storing the selected byte.

16. The integrated circuit device of claim 1, wherein the controller includes circuits to apply the erase potentials on a word line coupled to memory cells storing the selected byte and on the bit lines coupled to the memory cells storing the selected byte, and to apply erase inhibit potentials to other word lines in the plurality of word lines in the selected page.

17. The integrated circuit device of claim 1, wherein the controller includes circuits to apply the erase potentials on a word line coupled to memory cells storing the selected byte and on the bit lines coupled to the memory cells storing the selected byte, and to float to other bit lines in the plurality of bit lines not coupled to memory cells storing the selected byte.

18. A method for performing byte erase in a programmable and erasable memory array, the memory array including a plurality of programmable and erasable memory cells arranged in rows and columns, and having a plurality of word lines coupled to memory cells along a row and a plurality of bit lines coupled to memory cells along a column configured to support vertical pages, vertical pages including a plurality of byte wide sets of memory cells, the byte wide sets of memory cells being coupled to respective word lines in the plurality of word lines, and coupled to bit lines in the plurality of bit lines in common with the other byte wide sets of memory cells of the vertical page, the method comprising:
   addressing at least one selected byte at a time for erase processes in a selected vertical page by selecting one word line, and bit lines in the plurality of bit lines in common with the other byte wide sets of memory cells of the vertical page;
   mapping data in memory cells coupled to word lines in the selected vertical page other than the selected one word line;
   applying erase potentials to memory cells storing the at least one selected byte; and
   after applying erase potentials to memory cells storing the at least one selected byte, verifying that memory cells coupled to word lines in the selected page other than the selected one word line have maintained thresholds indicated by the mapping, and applying program potentials to memory cells in the selected page that do not pass verify.

19. The method of claim 18, wherein the memory array includes
   a plurality of sectors, the respective sectors including a plurality of blocks, the respective blocks including a plurality of programmable and erasable memory cells arranged in rows along the plurality of word lines, and in columns along the plurality of bit lines;
   wherein the byte wide set of memory cells includes one memory cell from each block in the plurality of blocks, and wherein the bit lines in common with the other byte wide sets of memory cells of the vertical page include one selected bit line within each block in the set of blocks of a particular sector.

20. The method of claim 18, wherein said byte wide set of memory cells includes eight memory cells.

21. The method of claim 18, wherein the mapping of data in the memory cells coupled to word lines in the selected vertical page other than the selected one word line includes reading data in the selected page, and storing addresses of memory cells having a programmed threshold level in temporary storage.

22. The method of claim 18, wherein the mapping of data in the memory cells coupled to word lines in the selected vertical page other than the selected one word line includes reading data in the selected page, and setting flags in a plurality of word line flags for word lines coupled to memory cells having a programmed threshold level in temporary storage.

23. The method of claim 18, wherein the mapping of data in the memory cells coupled to word lines in the selected vertical page other than the selected one word line includes reading data in the selected page, and storing read data in temporary storage.

24. The method of claim 18, wherein the mapping of data in the memory cells coupled to word lines in the selected vertical page other than the selected one word line is executed after applying erase potentials to the selected byte.

25. The method of claim 18, wherein the mapping of data in the memory cells coupled to word lines in the selected vertical page other than the selected one word line is executed before applying erase potentials to the selected byte.

26. The method of claim 18, wherein said at least one selected byte consists of one byte.

27. The method of claim 18, wherein two columns of memory cells are coupled to each of said bit lines in the plurality of bit lines, and memory cells in the two columns coupled to a particular bit line on a particular word line are erased by the erase potentials applied to the particular word line and the particular bit line, and wherein said at least one selected byte consists of two bytes and the vertical page is two bytes wide.

28. The method of claim 18, wherein said memory cells comprise charge programmable memory cells.

29. The method of claim 18, wherein said memory cells comprise nitride MOS memory cells.

30. The method of claim 18, wherein said memory cells comprise floating gate memory cells.

31. The method of claim 18, wherein said erase potentials comprise a negative voltage on a word line coupled to memory cells storing the selected byte and a positive voltage on the bit lines coupled to the memory cells storing the selected byte.

32. The method of claim 18, wherein applying the erase potentials includes applying erase voltages on a word line coupled to memory cells storing the selected byte and on the bit lines coupled to the memory cells storing the selected byte, and applying erase inhibit potentials to other word lines in the plurality of word lines.

33. The method of claim 18, wherein applying the erase potentials includes applying erase voltages on a word line coupled to memory cells storing the selected byte and on the bit lines coupled to the memory cells storing the selected byte, and floating to other bit lines in the plurality of bit lines.

* * * * *